US010686292B2

(12) United States Patent
Nagatomo et al.

(10) Patent No.: US 10,686,292 B2
(45) Date of Patent: Jun. 16, 2020

(54) LASER MODULE

(71) Applicant: STANLEY ELECTRIC CO., LTD., Meguro-ku, Tokyo (JP)

(72) Inventors: Daisuke Nagatomo, Tokyo (JP); Yoshio Okamoto, Tokyo (JP); Takashi Nakai, Tokyo (JP); Kenji Nagashima, Tokyo (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 16/388,531

(22) Filed: Apr. 18, 2019

(65) Prior Publication Data

US 2019/0326725 A1    Oct. 24, 2019

(30) Foreign Application Priority Data

Apr. 23, 2018    (JP) .................................. 2018-082317

(51) Int. Cl.
*H01S 3/10* (2006.01)
*H01S 5/022* (2006.01)

(52) U.S. Cl.
CPC ........ *H01S 5/02252* (2013.01); *H01S 5/0226* (2013.01); *H01S 5/02268* (2013.01); *H01S 5/02272* (2013.01); *H01S 5/02284* (2013.01); *H01S 5/02288* (2013.01); *H01S 5/02212* (2013.01)

(58) Field of Classification Search
CPC ............. H01S 5/02288; H01S 5/02284; H01S 5/02252; H01S 5/0226; H01S 5/02268; H01S 5/02272; H01S 5/02212
See application file for complete search history.

(56) References Cited

U.S. PATENT DOCUMENTS

| 5,296,724 A * | 3/1994 | Ogata | G02B 6/4204 257/680 |
|---|---|---|---|
| 6,229,831 B1 * | 5/2001 | Nightingale | G02B 6/4249 372/109 |
| 2011/0304897 A1 * | 12/2011 | Kasaya | G02B 6/4206 359/237 |
| 2019/0229495 A1 * | 7/2019 | Pierer | G02B 27/0172 |

FOREIGN PATENT DOCUMENTS

JP    2008250050 A    10/2008

* cited by examiner

*Primary Examiner* — Kinam Park
(74) *Attorney, Agent, or Firm* — Holtz, Holtz & Volek PC (57) ABSTRACT

A laser module has a base portion having a metal holding portion; a laser light source fixed to the base portion; an optical outputting portion deriving the laser light from a collimating optical system out of the base portion. The collimating optical system includes an input lens receiving the laser light from the laser light source; and an output lens receiving the laser light from the input lens and outputting the laser light to the optical outputting portion, each located in order from the laser light source. The input lens is a convex lens fixed in a first cylinder body made of metal and welded to the holding portion. The output lens is a convex lens having a focal point length longer than that of the input lens and held by the holding member glued to the base portion.

5 Claims, 11 Drawing Sheets

LASER MODULE

BACKGROUND OF THE INVENTION

1. Field of the Invention

The present invention relates to a laser module such as a semiconductor laser module or the like.

2. Description of the Related Art

There is known as an optical element unit for a laser module capable of irradiating convergent light to the end face of an optical element such as an optical fiber, s SHG element or the like (for example, Japanese Patent Application Laid-Open No. 2008-250050). An optical device unit is proposed in such Japanese Patent Application Laid-Open publication in that, with regard to an eccentric error between the light source and the lens, the lens is driven in a predetermined direction by a piezoelectric actuator to correct the eccentric error.

SUMMARY OF THE INVENTION

Generally, the laser light source and the collimator lens in the laser module are fixed by a YAG laser beam welding technique (which is a welding technique used to join pieces of metal or the like through the use of a YAG laser emitted from a single crystal of Neodymium added Yttrium-Aluminum-Garnet i.e. Nd:YAG of laser medium) or an adhesive bonding technique. These fixing techniques have advantages and disadvantages in reliability and in positional deviation when fixing the optical element.

Even if the position of a laser light source or a lens in the laser module is accurately determined by the fixing techniques at the time of assembly, stress is exerted during the welding or adhesive bonding, and then the position of the laser light source or the lens shifts to decrease the coupling efficiency thereof. The positional deviation at the time of fixing the optical element is generally large (from several micrometers to several tens of micrometers) for the YAG laser beam welding, and that is smaller (5 µm or less) for the adhesive bonding comparatively.

The bonding efficiency decreases even when the relative position between the laser light source and the collimator lens deviates due to temperature changing during usage of the module after fixed. Further, the position of the fixed part shifts as time passes after adhesive fixed, because there is occurrence of the curing shrinkage of the uncured components that slightly remains at the adhesive curing. With regard to the change with time, the YAG laser beam welding has less deformation and is more reliable than the adhesive bonding.

Generally the YAG laser beam welding is often adopted with emphasis on reliability, although there are merits and demerits as to the fixing methods. However, it is very difficult to suppress the welding positional deviation to 1 µm or less, and thus it takes a lot of cost to construct a mechanism to suppress the welding positional deviation.

It is an object of the present invention to provide a laser module capable of suppressing the decrease in coupling efficiency due to the positional deviation when fixing the optical element while maintaining the reliability during use.

In order to achieve the above object, the present invention is a laser module comprising:

a base portion that has a holding portion formed of a metal material;

a laser light source that is fixed to the base portion and emits laser light;

a collimating optical system that is fixed to the base portion and located on a path of the laser light; and an optical outputting portion that derives the laser light from the collimating optical system out of the base portion, wherein the collimating optical system includes an input lens that receives the laser light from the laser light source; and an output lens that receives the laser light from the input lens and outputs the laser light to the optical outputting portion, each being located in order from the laser light source on the path of the laser light, wherein the input lens is a convex lens that is fixed in a first cylinder body that is made of metal and welded to the holding portion, wherein the output lens is a convex lens that has a focal point length longer than that of the input lens, the output lens being held by the holding member glued to the base portion.

DETAILED DESCRIPTION OF THE INVENTION

A semiconductor laser module according to embodiments of the present invention will now be described below in detail with reference to the drawings. In those Examples, components having substantially the same function and configuration will be denoted by the same reference numerals, and redundant description will be omitted.

(Semiconductor Laser Module)

Figure 1:
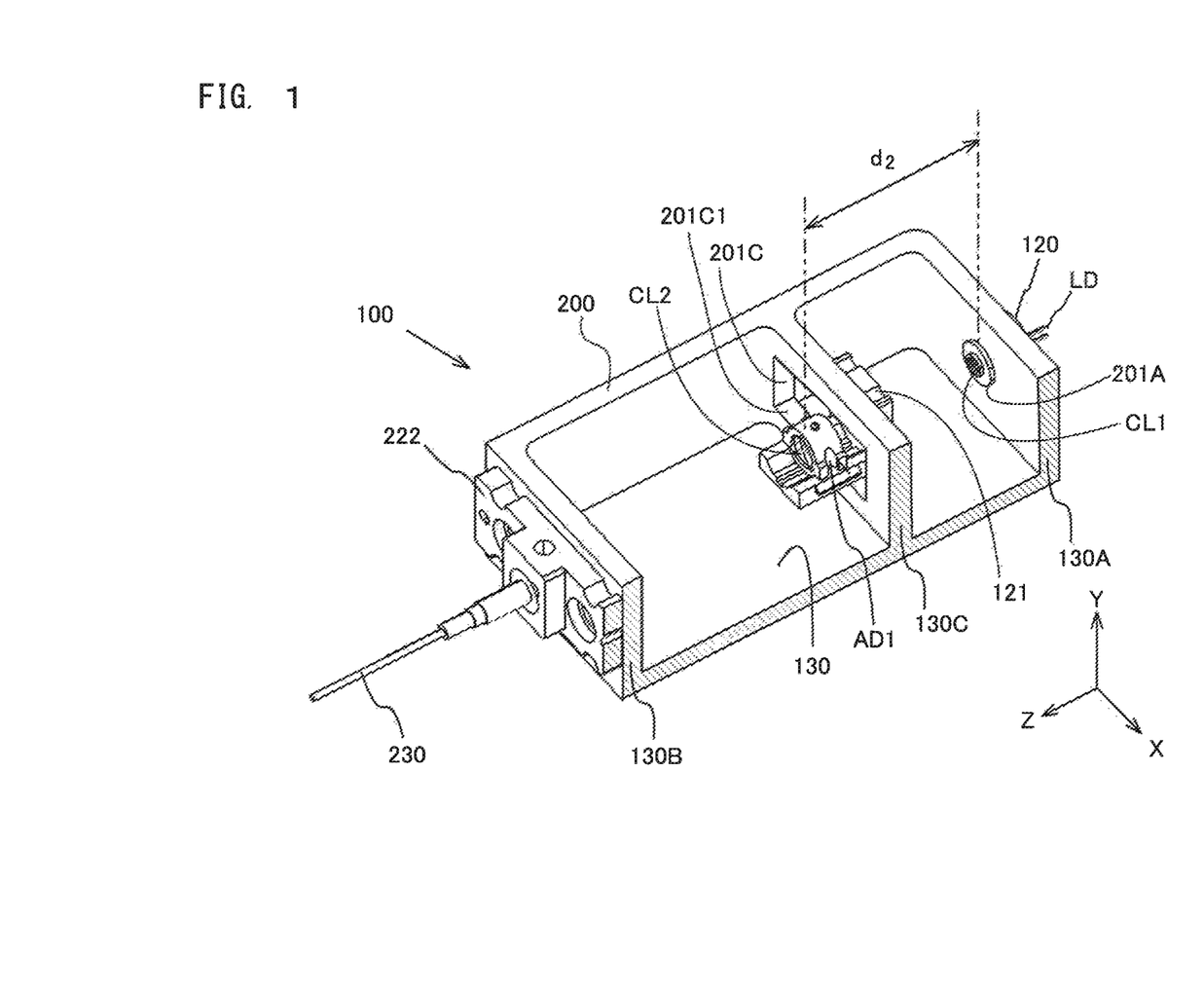
FIG. 1 is an exploded perspective view of a part of a semiconductor laser module according to an embodiment of the present invention.
Figure 2:
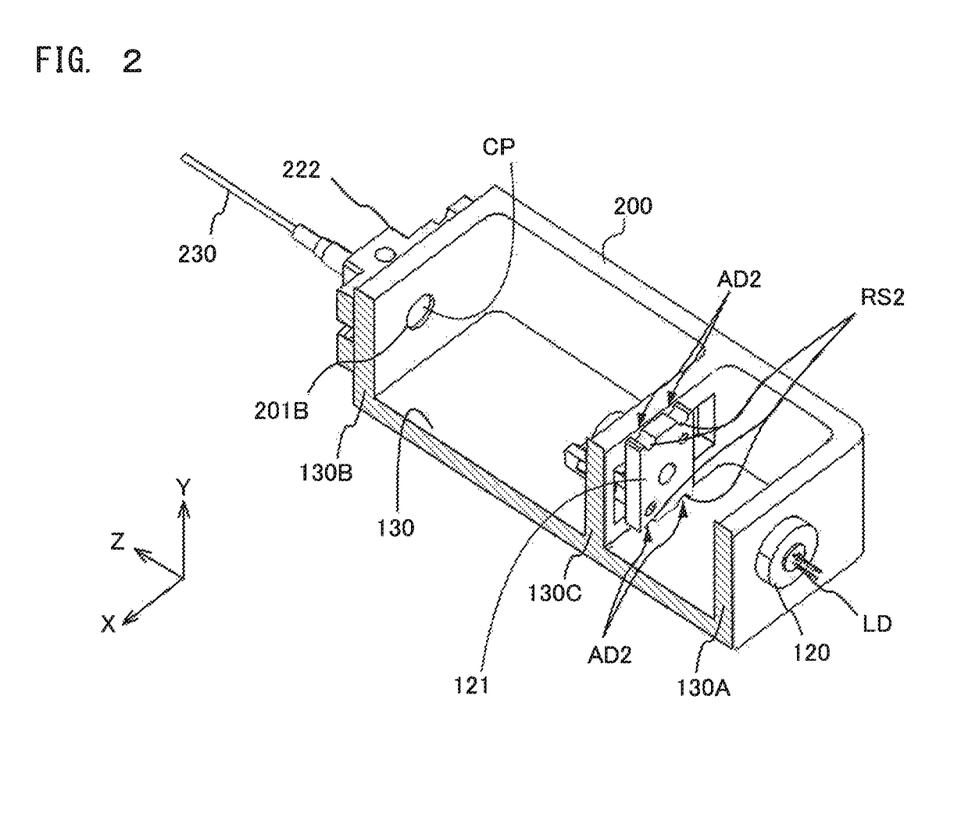
FIG. 2 is another exploded perspective view of the part of the semiconductor laser module according to the embodiment of the present invention.
Figure 3:
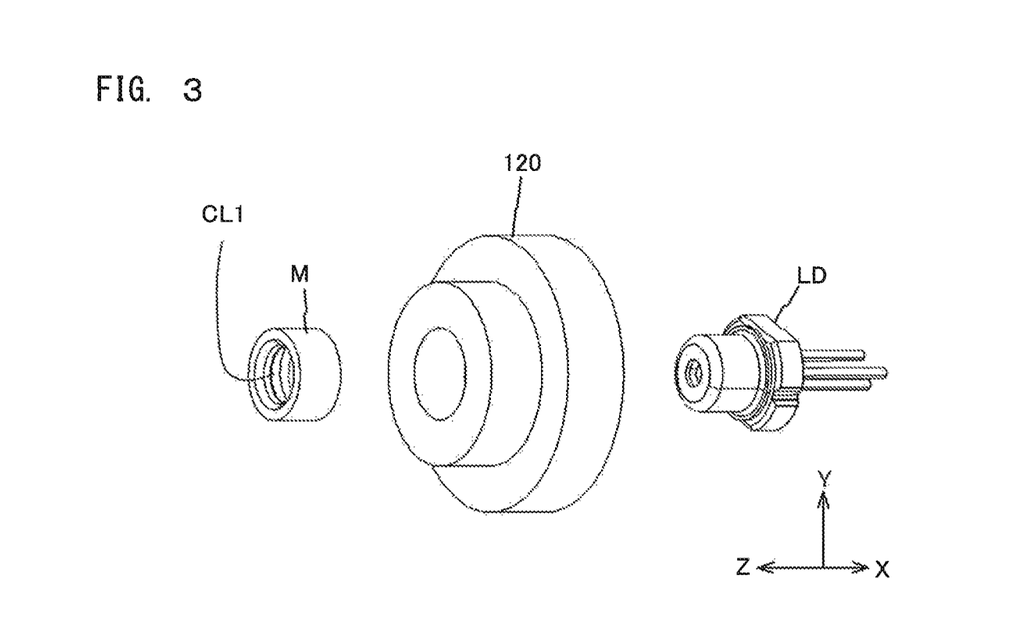
FIG. 3 is an exploded perspective view of a first cylinder body of the semiconductor laser module according to the embodiment of the present invention.

FIG. 1 and FIG. 2 are perspective views in which a part of a semiconductor laser module 100 of the present embodiment is disassembled and FIGS. 2 and 3 are plan and sectional views of the assembled state, and partial sectional views are included.

(Module Case)

The semiconductor laser module 100 includes a module case 200, which is a base portion having a holding portion formed of a metal material. The module case 200 is formed of a metal material in a hollow rectangular shape. An input base portion 130A, an output base portion 130B, and an intermediate base portion 130C are integrally formed in the inside of the module case 200 so as to be respectively set up from a bottom portion 130 of the module case. Each of the portion 130B and the intermediate base portion 130C has a flat parallel inner wall extending in directions (Y direction and X direction) perpendicular to the optical axis direction (Z direction) of a laser light source LD, and various parts are mounted on the inner walls.

A circular aperture portion 201A is opened as a first cylinder body holding portion in the input base portion 130A at one end of the module case 200.

(First Cylinder Body)

A first cylinder body 120 holding an input lens CL1 is fixed to the edge of the aperture portion 201A as follows: The input lens CL1 is inserted from one end side and fitted into the first cylinder body 120 made of metal as shown in FIG. 3. After that, the first cylinder body 120 and the sleeve M are fixed by the YAG laser beam welding. In addition, the input lens CL1 have a metal sleeve M in which a convex lens CL1 is fitted and held previously.

Figure 4:
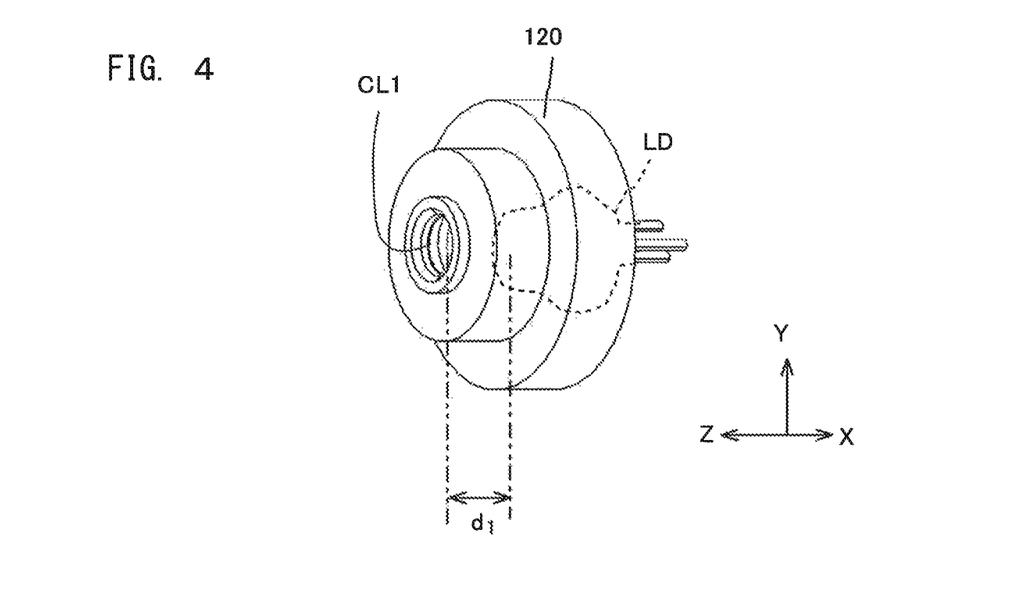
FIG. 4 is a perspective view showing the first cylinder body of the semiconductor laser module according to the embodiment of the present invention.

As shown in FIG. 3, the laser light source LD has a semiconductor laser of a metal can type (CAN package) which is fitted in the first cylinder body 120 from the other end side, and both of them are fixed from the YAG laser beam welding. The laser light source LD has its light emitting point positioned at a predetermined distance $d_1$ (at or near the focal position) from the input lens CL1. The first cylinder body 120 functions as a cylindrical holder for fixing the laser light source LD (FIG. 4). Furthermore, the first cylinder body 120 is fitted in the aperture portion 201A and fixed by the YAG laser beam welding.

(Optical Fiber)

Figure 5A:
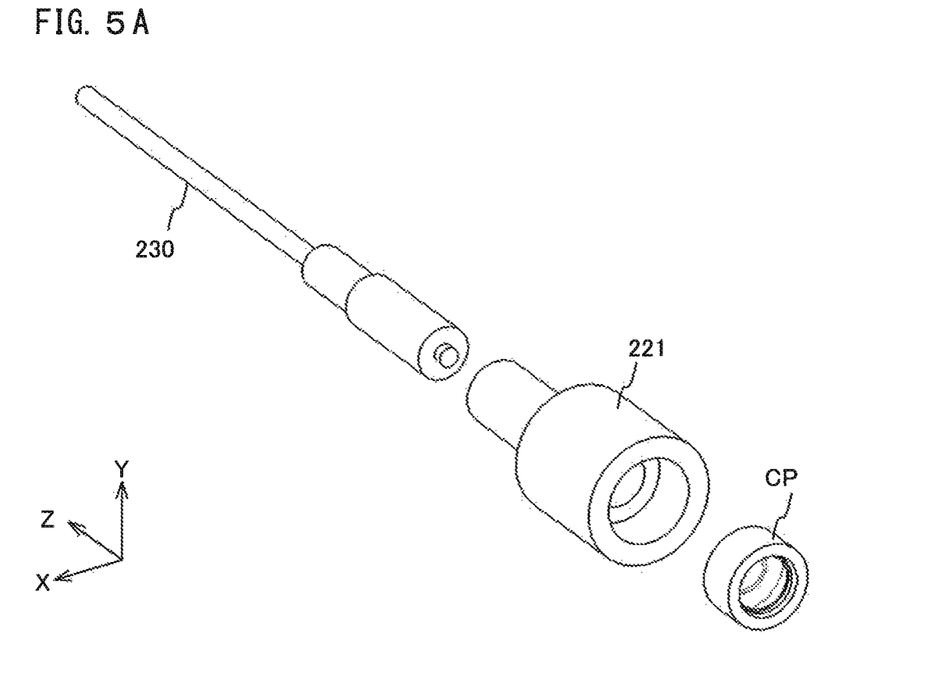
FIGS. 5A and 5B are an exploded perspective view and an assembled perspective view showing a coupling lens pigtail of an optical fiber of the semiconductor laser module according to the embodiment of the present invention, respectively.
Figure 5B:
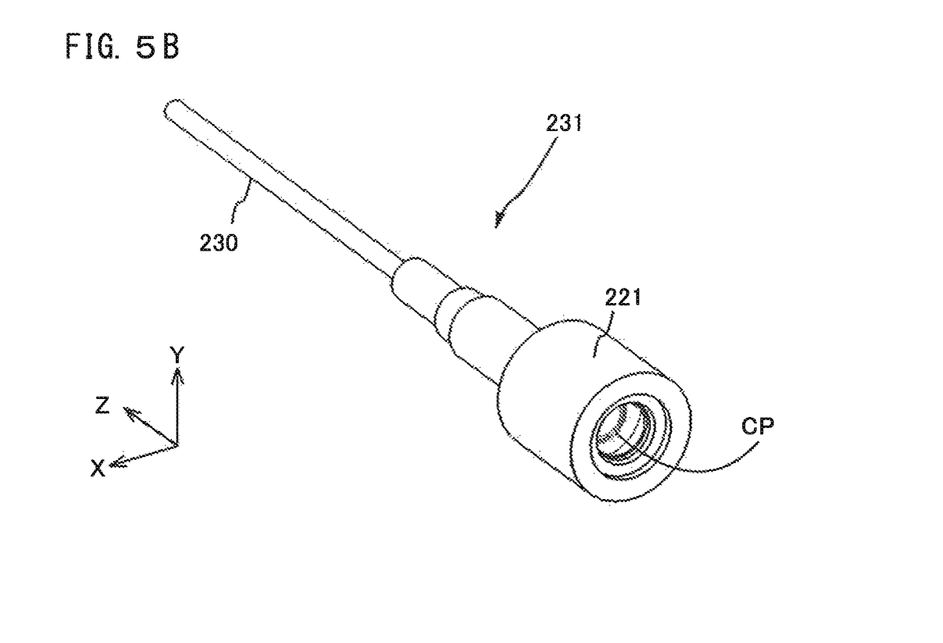

As shown in FIG. 1 and FIG. 2, a circular aperture portion 201B is opened as an optical fiber holding portion on the output base portion 130B at the other end of the module case 200. At this aperture portion, an optical fiber 230 (coupling lens pigtail) is fixed to the edge of the aperture portion 201B as follows:

As shown in FIG. 5A, the coupling lens CP is inserted from one end into a lens barrel 221 made of metal and fixed by a solder material or the like. The lens barrel 221 functions as a cylindrical holder for fixing one end of the optical fiber 230 and is configured as a pigtail 231 of the optical fiber 230 (FIG. 5B). In the pigtail 231 of the optical fiber 230, the optical fiber 230 is positioned in such a manner that its end face at one end is located at the focal position of the coupling lens CP.

Figure 6A:
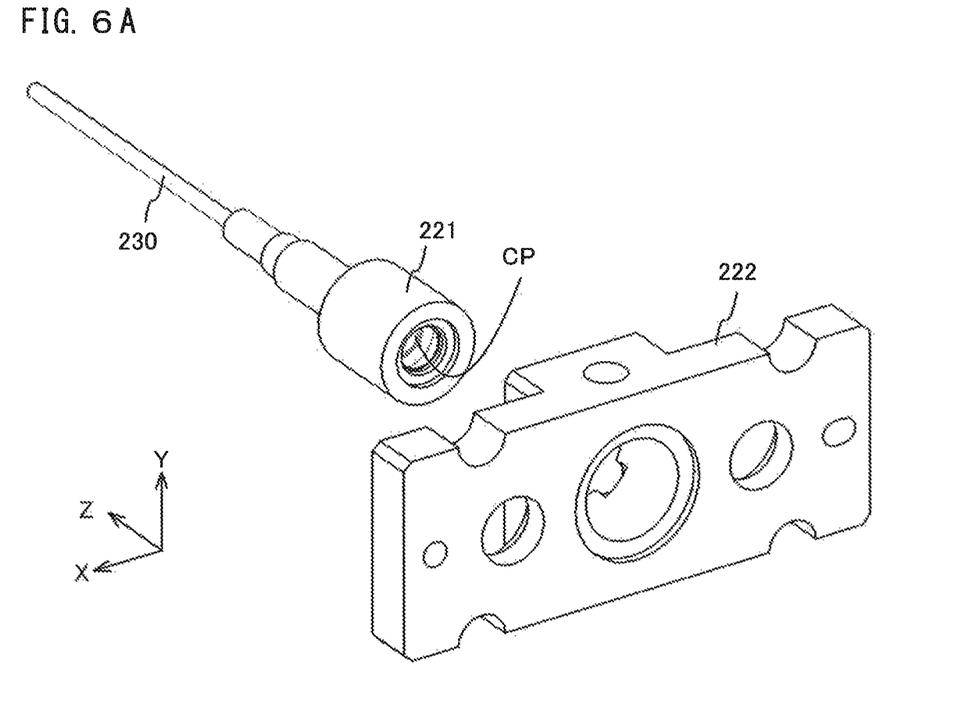
FIGS. 6A and 6B are an exploded perspective view of an assembly of the optical fiber and a holder of the semiconductor laser module of the embodiment of the present invention and a perspective view thereof after assembled, respectively.
Figure 6B:
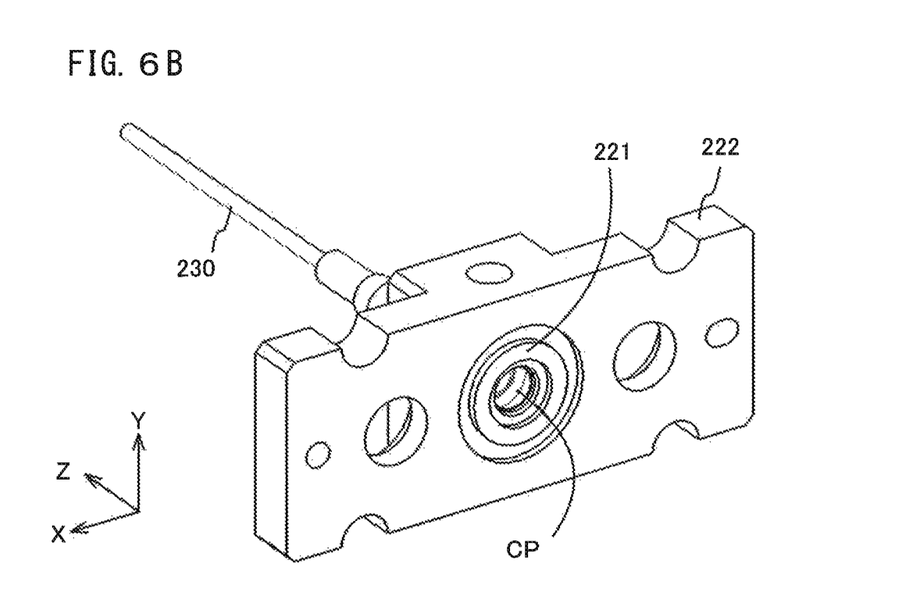

As shown in FIG. 6, the lens barrel 221 of the optical fiber 230 is fitted in a holder 222 and fixed by the brazing material or adhesive, so that the optical fiber 230 is fixed to the edge of the aperture portion 201B by a brazing material or adhesive via the holder 222 (FIG. 1 and FIG. 2). Thus, the coupling lens CP of the convex lens is provided between an output lens CL2 (described later) and the optical fiber 230 on the optical axis of the laser light source LD.

(Lens Unit: Holding Member)

As shown in FIG. 1 and FIG. 2, a rectangular aperture portion 201C is opened as a lens unit holding portion in the intermediate base portion 130C of the module case 200. An XZ plane portion on which the lens unit 121 is temporarily placed is provided at the lower flat portion 201C1 of the aperture portion 201C.

Figure 7:
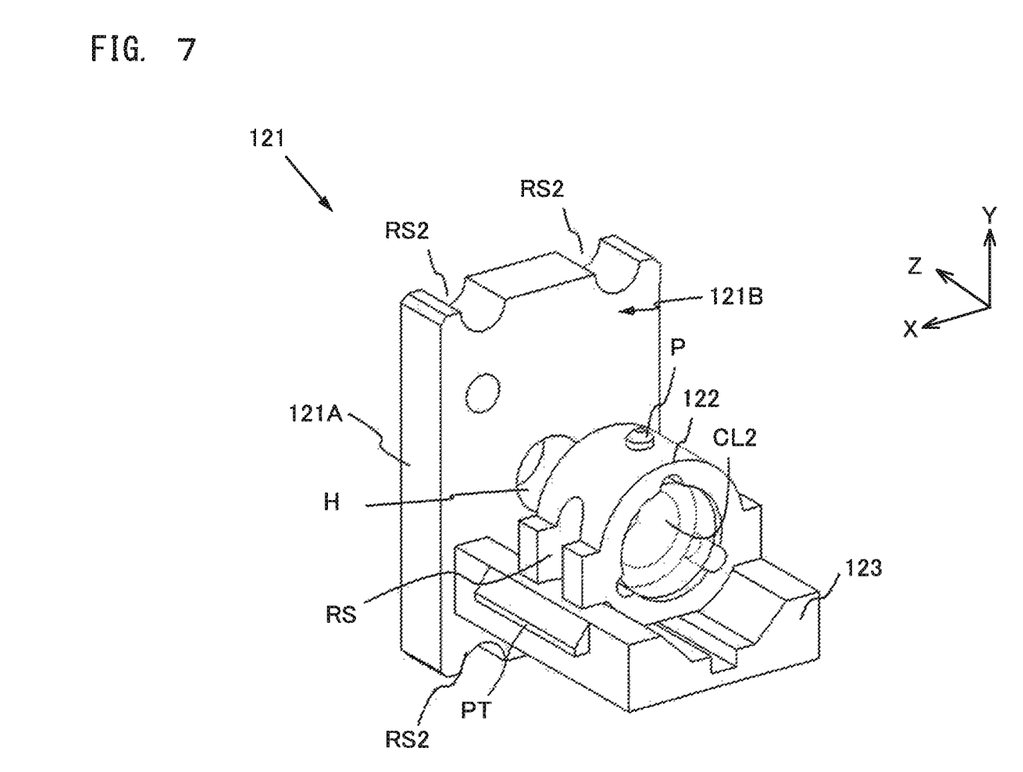
FIG. 7 is a perspective view showing a lens unit of the semiconductor laser module of the embodiment of the present invention.
Figure 8:
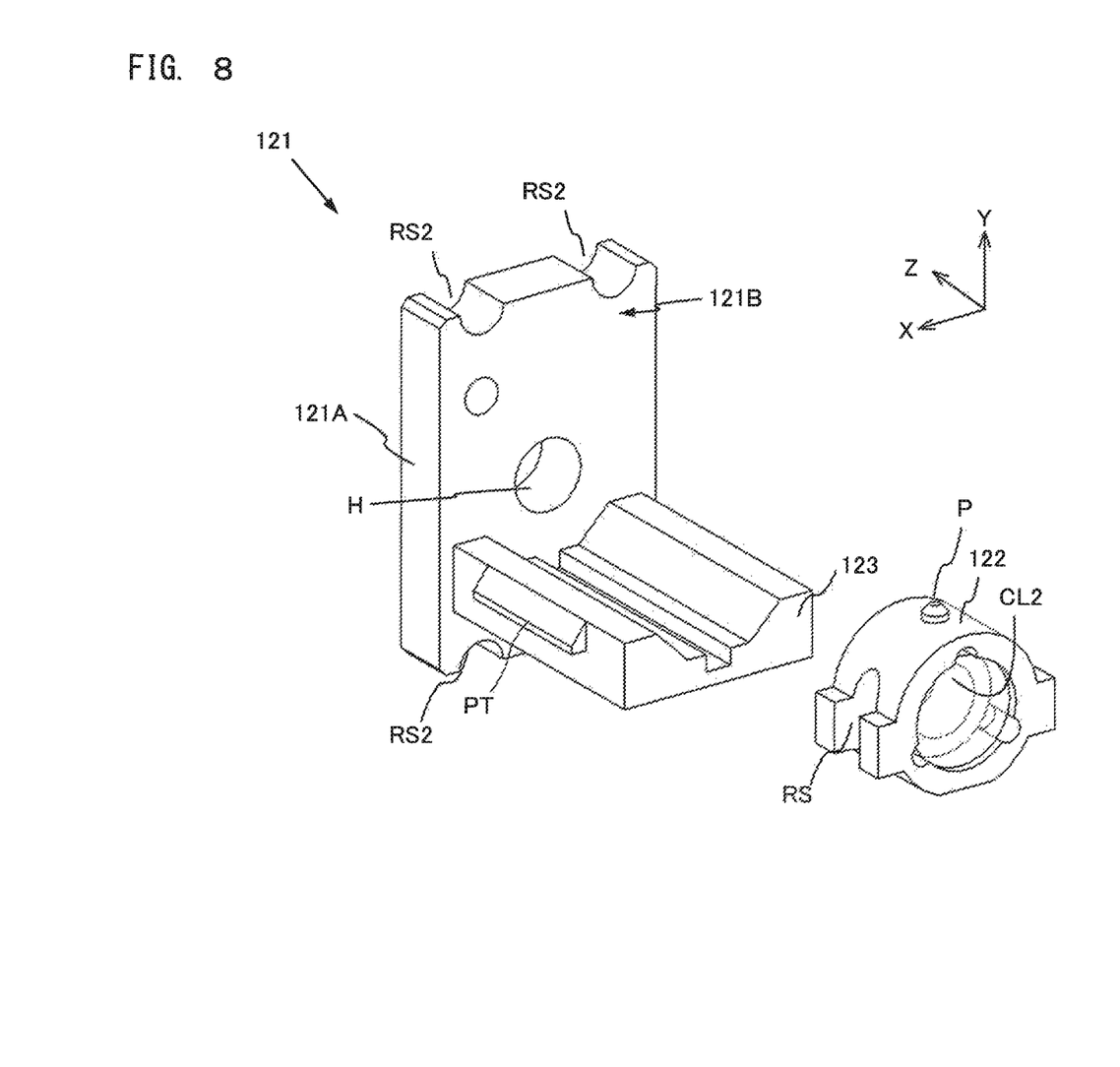
FIG. 8 is an exploded perspective view of the lens unit of the semiconductor laser module of the embodiment of the present invention.

As shown in FIGS. 7 and 8, the lens unit 121 comprises a second cylinder body 122; a groove member 123; and a unit base portion 121A orthogonally coupled to the groove member 123. The second cylinder body 122 supports the output lens CL2 of a convex lens having a focal point length longer than that of the input lens CL1. The groove member 123 is a support portion having a groove surface supporting the second cylinder body 122 and extending from the unit base portion 121A in the Z direction. The unit base portion 121A has the supporting flat surface 121B spreading in the XY plane and having a through hole H which can transmit light emitted from the laser light source LD.

The groove member 123 has a groove having a U-shaped cross section shape or a V-shaped cross section shape opened in the upward direction (Y direction), and the side surface of the second cylinder body 122 is in contact with the side surfaces of the groove.

Figure 9:
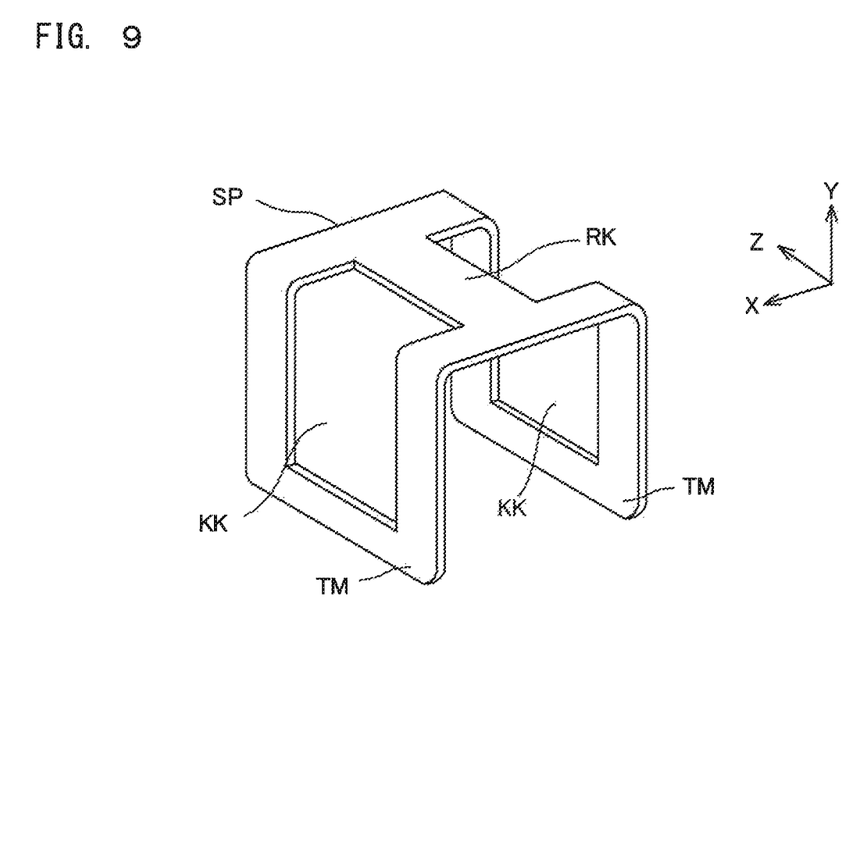
FIG. 9 is a perspective view showing a supporting spring member of the semiconductor laser module according to the embodiment of the present invention.
Figure 10:
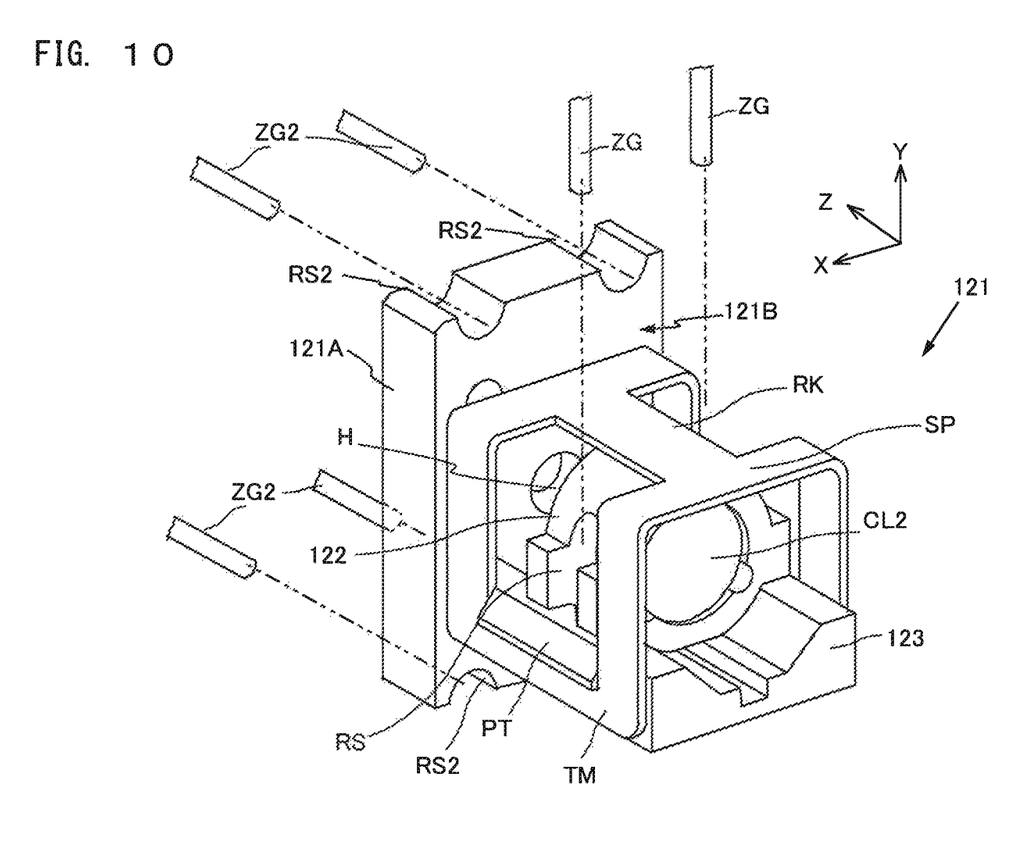
FIG. 10 is a perspective view showing the lens unit with the supporting spring member of the semiconductor laser module of the embodiment of the present invention.

As shown in FIG. 9 and FIG. 10, the lens unit 121 has the supporting spring member SP, which is an elastic holding portion that can be attached to and detached from the groove member 123 via a snap fit structure. The supporting spring member SP has a shape that is opened in the Y direction. The supporting spring member SP has a coupling portion RK for holding the second cylinder body 122 by sandwiching with the groove member 123. The supporting spring member SP has two aperture portions KK through which actuator jigs ZG pass, both are provided on both sides of the connection portion RK. The supporting spring member SP has two claw portions TM at its tips that engage with the protrusions PT of the groove member 123.

As shown in FIG. 10, the supporting spring member SP movably supports the second cylinder body 122 in the optical axis direction (Z direction) of the laser light source when the optical axis of the output lens CL2 is aligned on the groove member 123. The second cylinder body 122 has a pair of recesses RS for inserting the tips of the movable actuator jigs ZG in the Y direction. The actuator jigs ZG after the insertion move the second cylinder body 122 in the Z direction. After the optical axis alignment of the output lens CL2 by the actuator jigs ZG, adhesives are applied to the recesses RS and then the second cylinder body 122 is fixed to the groove member 123 with the adhesives (AD1 in FIG. 1). Such adhesives may use flexible adhesives. The second cylinder body 122, the groove member 123, the supporting spring member SP and the actuator jigs ZG function as a position adjustment mechanism in the optical axis direction of the output lens CL2. The output lens CL2 is adjusted to be positioned at a predetermined distance $d_2$ from the input lens CL1.

The unit base portion 121A has recesses RS2 for inserting the tips of the movable actuator jigs ZG2 in the Z direction. The movable actuator jigs ZG2 grip the unit base portion 121A with the four recesses RS2 and move the lens unit 121, namely the movable actuator jigs ZG2 are a part of a fixing device for the bonding. The actuator jigs ZG2 after insertion move the lens unit 121 in directions (Y direction, X direction) perpendicular to the optical axis direction of the laser light source while be in close contact with the inner wall of the intermediate base portion 130C. In this case, the supporting flat surface 121B of the unit base portion 121A movably supports the unit base portion 121A in the Y direction and the X direction when the optical axis of the output lens CL2 is aligned. After the unit base portion 121A of the lens unit 121 is aligned in the optical axis of the output lens CL2, multiple adhesive drops are applied between the side surface of the unit base portion 121A and the intermediate base portion 130C and to multiple locations (four AD2 in FIG. 2) and then the unit base portion 121A is fixed to the intermediate base portion 130C. The unit base portion 121A, the intermediate base portion 130C and the actuator jigs ZG2 function as a position adjustment mechanism in a direction perpendicular to the optical axis of the output lens CL2. It is possible to use a hard and strong adhesive for such adhesive drops.

As described above, in the module case 200, a colliding optical system (the input lens CL1 and the output lens CL2) is provided between the fixed laser light source LD and the optical outputting portion (the optical fiber 230).

The collimating optical system includes the input lens CL1 that receives light from the laser light source LD, and the output lens CL2 that is positioned near the optical fiber 230 and outputs light from the input lens CL1 to the optical outputting portion. The input lens CL1 and the output lens CL2 are located on the optical axis of the laser light source LD. In this embodiment, the input lens CL1 is fixed with a weld portion (the first cylinder body 120 is welded to the metal base, but not shown), and the output lens CL2 is fixed with a plurality of adhesive parts AD1, AD2 (the lens unit is bonded to the metal base). By adopting such a bonding method, there is obtained an advantageous effect that the positional deviation of the lens due to the progress of curing shrinkage of the adhesive does not occur.

In this embodiment, the collimator lens system CL is configured to have two convex lenses (the input lens CL1 and the output lens CL2), and the input lens CL1 is configured to have a short focus, and the output lens CL2 is configured to have a long focus.

In this embodiment, the input lens CL1, which has high sensitivity to errors in an eccentric error between the light source and the lens, is fixed to the base by the YAG laser beam welding to ensure reliability when using the semiconductor laser module. The position deviation that occurs during the YAG laser beam welding of the input lens CL1 is corrected with the position adjustment of the output lens CL2, which has low error sensitivity, and then the output lens CL2 is fixed.

As a result, it is possible to suppress a decrease in coupling efficiency due to a positional deviation at the time of fixing the optical element while maintaining the reliability at the time of usage of the laser module.

Figure 11A:
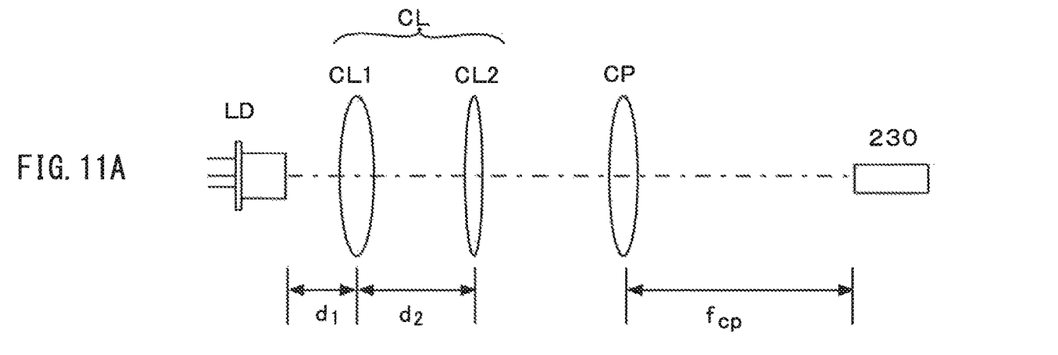
FIGS. 11A, 11B and 11C are diagrams illustrating arrangements of optical elements for collimating light from the laser light source with a collimator lens system as parallel light and for focusing it the optical fiber with the coupling lens in a configuration of the embodiment of the present invention, respectively.
Figures 11B, 11C:
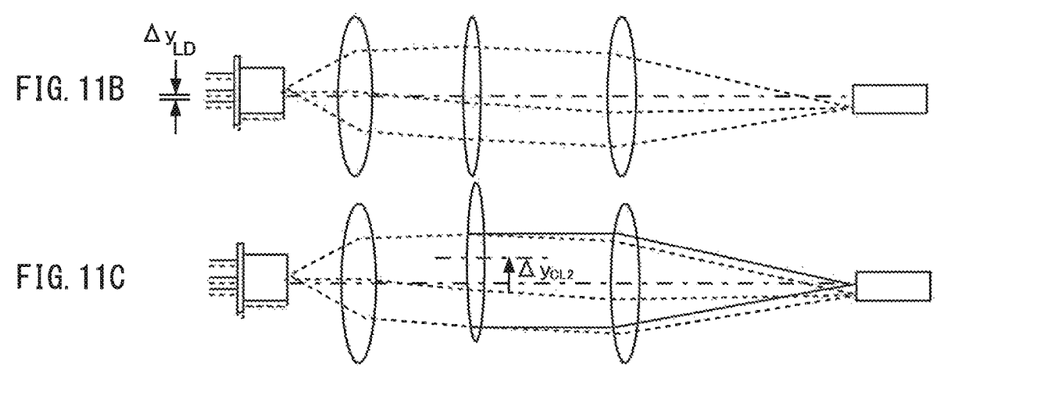

FIG. 11 illustrates one configuration of the present embodiment of the arrangement of the optical elements for collimating light from the laser light source LD with a collimator lens system CL (the input lens CL1 and the output lens CL2) as parallel light and for focusing it the optical fiber 230 with the coupling lens CP.

The focal lengths of the collimator lens system CL (the input lens CL1 and the output lens CL2) and the coupling lens CP are selected so that the coupling efficiency is optimized on the basis of the aperture (mode field diameter=MFD) and the angle (numerical aperture=NA) that can capture the light of the optical fiber 230. A focused spot size $y_2$ at the end face of the optical fiber 230 is scaled up or down by $\beta$ times a size $y_1$ of the light source by the collimator lens system as follows:

$$y_2 = \beta y_1 \quad (1).$$

where the magnification $\beta$ is determined by the ratio of the focal length $f_{CL}$ of the collimator lens CL to the focal length $f_{CP}$ of the coupling lens CP.

$$\beta = f_{CP}/f_{CL} = \psi_{CL}/\psi_{CP} \quad (2).$$

where $\psi_{CL}$ and $\psi_{CP}$ are the inverse numbers of $f_{CL}$ and $f_{CP}$ respectively.

Equation (1) can also be implied as $y_2$ is a spot fluctuation if a positional deviation of the laser light source LD occurs by $y_1$ (in a plane perpendicular to the optical axis).

When the optical fiber 230 is a single mode optical fiber, its MFD depends on the wavelength of light and is about 5 μm or less in the visible region. When a focused spot is larger than the MFD or placed at a position deviated from the MFD, the coupling efficiency to the optical fiber 230 is lowered. Further, the angle (NA) at which the optical fiber 230 can take in light also depends on the wavelength, and the angle (NA) may be mostly around 0.1 (half-angle 5.7 deg.) in the visible light region.

FIG. 11A represents a light beam when the laser light source LD is slightly shifted upward by $\Delta y_{LD}$ when the laser light source LD and the input lens CL1 are subjected to the YAG laser beam welding. As a result of the collimated light from the output lens CL2 being tilted due to the displacement $\Delta y_{LD}$ of the source LD, the position of the focused spot on the optical fiber 230 is shifted downward.

FIG. 11C illustrates a light beam by a solid line when the spot position is corrected by the position adjustment of the output lens CL2 in the state shown in FIG. 11B.

Since the focal length of the output lens CL2 is longer than the focal length of the input lens CL1, the adjustment amount $\Delta y_{CL2}$ of the output lens CL2 is larger than the displacement $\Delta y_{LD}$ (error sensitivity is lower for the output lens CL2). Thus, adjustment of optical axis with high accuracy is readily realized. As a result of the adjustment, the collimated light after the output lens CL2 has no inclination, and the spot can be easily moved to the desired position.

Assuming that the ratio of the adjustment amount $\Delta y_{CL2}$ of the output lens CL2 to the displacement $\Delta y_{LD}$ of the laser light source LD in the YAG laser beam welding is a sensitivity ratio R, as R increases, the degree of adjustment difficulty decreases and the fixing accuracy improves. The sensitivity ratio R can be calculated as the following equation (3).

$$R = \Delta y_{LD}/\Delta y_{CL2} = \psi_{CL}/\psi_{CL2} \quad (3)$$

Here, $\psi_{CL}$ is the inverse number of the synthetic focal length $f_{CL}$ of the collimator lens CL, and $\psi_{CL2}$ is the inverse number of the focal length $f_{CL2}$ of the output lens CL2. The $\psi_{CL}$ is determined by the equation (2) from the magnification $\beta$ to be designed.

Also, the distance $d_1$ between the input lens CL1 and the laser light source LD and the distance $d_2$ between the input lens CL1 and the output lens CL2 can be calculated by the following equations.

$$d_2 = (\psi_{CL1} + \psi_{CL2} - \psi_{CL})/\psi_{CL1}\psi_{CL2} \quad (4)$$

$$d_1 = (d_2\psi_{CL2} - 1)/\psi_{CL} \quad (5).$$

Here, $\psi_{CL1}$ is the inverse of the focal length $f_{CL1}$ of the input lens CL1.

If the target values of $d_1$ and $d_2$ are determined on the basis of the design constraints, the appropriate $\psi_{CL1}$ can be determined based on $\psi_{CL}$ and $\psi_{CL2}$ determined by the equations (2) and (3).

As a constraint, for example, $d_1$ needs to be a certain value or more. Since the light emission position is inside the package of the laser light source LD, $d_1$ takes a certain value or more to avoid physical interference between the input lens CL1 and the laser light source LD.

In addition, for $d_2$, it is necessary to secure a sufficient space where a position adjustment mechanism of the output lens CL2 can be installed.

(Manufacturing Method of the Semiconductor Laser Module of the Embodiment)

Figure 12:
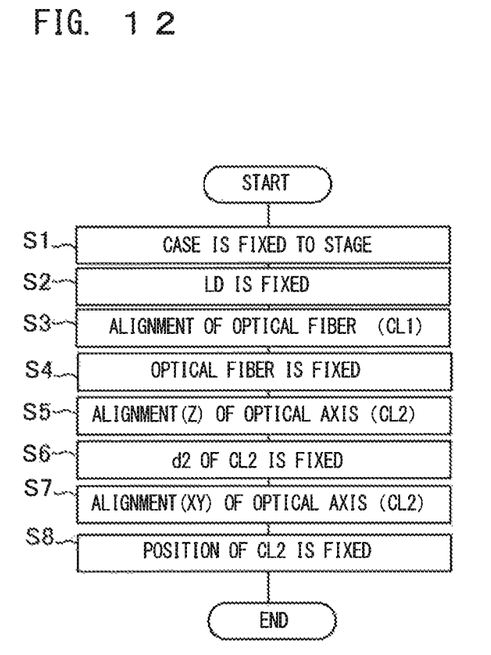
FIG. 12 is a flow diagram illustrating an optical axis alignment process in a method of manufacturing the semiconductor laser module according to an embodiment of the present invention.

The optical axis alignment steps in the method of manufacturing the semiconductor laser module of the embodiment will be described with reference to FIG. 12.

First, in step S1, the module case 200 is fixed to a working stage (not shown). At this time, the positioning on the stage is performed as follows: The module case 200 is positioned by setting so that the optical axis direction of the laser light source LD is in the Z direction and the XY directions are perpendicular to the Z direction.

Then, the laser light source LD (the input lens CL1) and the optical fiber 230 (the coupling lens CP) are pre-installed within through holes (the aperture portions 201A and 201B) of the input base portion 130A and the output base portion 130B in the module 200, respectively.

In step S2, the laser light source LD of the input base portion 130A is fixed, and in step S3, the optical axis of the optical fiber 230 disposed in the output base portion 130B is matched to by means of the coupling lens CP.

Next, in step S3, the laser light source LD mounted on the input base portion 130A is connected to a power supply (not shown) to supply power to the laser light source LD to emit light. The light converged from the laser light source LD through the input lens CL1 and the coupling lens CP is detected through the optical fiber 230, and photometry is performed with a light detector (not shown), and then alignment of the optical fiber 230 (the coupling lens CP) is performed so as to maximize the photometric value.

In step S4, the optical fiber 230 is fixed to the edge of the aperture portion 201B with an adhesive via the holder 222 in the state of optical axis alignment.

Next, in step S5, the lens unit 121 is placed on the lower flat portion 201C1 of the aperture portion 201C of the intermediate base portion 130C via the bottom surface of the groove member 123. Furthermore, the second cylinder body 122 is disposed on and between both sides of the groove member 123 of the lens unit 121. That is, the second spring body 122 is held between both sides of the groove member 123 by the supporting spring member SP. In this way, the second cylinder body 122 is held by the actuator jigs ZG so that the second cylinder body 122 can be moved in the Z direction on the groove member 123. Then, the laser light source LD is powered to emit light. The light converged from the laser light source LD through the output lens CL2 and the coupling lens CP is detected through the optical fiber 230, and photometry is performed with a light detector (not shown), and then alignment of the optical axis (Z direction) of the output lens CL2 is performed so as to maximize the photometric value. Here, the second cylinder body 122 is moved in the Z direction by the actuator jigs ZG to align the optical axis (focusing) of the output lens CL2 to the laser light source LD.

Then, in step S6, the groove member 123 and the second cylinder body 122 are fixed at the focused position of the output lens CL2 in such a manner that an adhesive is provided at a plurality of points on the boundary between the groove member 123 and the second cylinder body 122 in the adhesive portion AD1 shown in FIG. 1. By this step, the $d_2$ of the output lens CL2 is fixed. By adopting such a bonding method, the supporting spring member SP pressing the second cylinder body prevents from occurrence of misalignment caused by the progress of curing shrinkage of the adhesive.

Then, in step S7, by the actuator jigs ZG2, the lens unit 121 is moved on the supporting flat surface of the intermediate base portion 130C in the X and Y directions while the unit base portion 121A and the intermediate base portion 130C are movably in close contact with each other, so that fine alignment of the second cylinder body 122 with the laser light source LD is performed. Also in this case, the laser light source LD is powered to emit light and then, by using the optical fiber 230 and a light detector (not shown), the XY position of the lens unit 121 is set so as to maximize the photometric value detected from light converged and passed through the output lens CL2 and the coupling lens CP.

Then, in step S8, at the position that the alignment of the optical axis is preformed, multiple adhesive drops are applied to the boundary between the unit base portion 121A and the intermediate base portion 130C and to multiple locations as in the adhesive portion AD2 shown in FIG. 2 and then the unit base portion 121A is fixed to the intermediate base portion 130C. By adopting such a sliding adhesion method, no component of force is generated in the X direction and the Z direction, and the stress is balanced in the Y direction. Therefore, the positional deviation of the unit holder due to the progress of curing shrinkage of the adhesive can be minimized. By this, there is completed the installation of the output base lens CL2 whose optical axis is aligned with the laser light source LD into the intermediate base portion 130C.

According to the above manufacturing process, when fixing the output lens CL2 to the intermediate base portion 130C, by making the laser light source LD emit light and using the emitted light for both alignments of the output lens CL2 in an optical axis (focus) and in the X and Y directions perpendicular to the optical axis. By theses, it possible to fix the intermediate lens unit 121 of the output lens CL2 to the intermediate base portion 130C with an adhesive, so that the assembly of the semiconductor laser module becomes possible while the optical axis is aligned with high precision.

(Effect of the Invention)

The degree of difficulty in adjusting the optical axis during assembly is reduced while the reliability of the light output is maintained by suppressing the positional deviation of the optical component caused by temperature change and aging, and the production of the semiconductor laser modules with good coupling efficiency can be performed inexpensively.

(Reduced Assembly Difficulty)

Using this embodiment, the output lens CL2 is corrected by an adjustment amount multiplied by R with respect to the displacement generated when the input lens CL1 is fixed. The positional deviation when the output lens CL2 is fixed is reduced to 1/R times when converted to the positional deviation of the input lens CL1, so that influence of the positional deviation can be reduced. As a result, the decrease in coupling efficiency can be suppressed. Since the output lens CL2 is fixed by the adhesive bonding, the positional deviation at the time of fixing can be further reduced.

For example, if the displacement by the YAG laser beam welding during fixing of the laser light source LD is assumed to be 10 μm, the design with R=10 can be corrected by moving the output lens CL2 by 100 μm. In the case of the YAG laser beam welding, the positional deviation at the time of fixing occurs similarly to 10 μm, but when it is converted to the positional deviation of the laser light source LD in the prior art, it becomes 1 μm, and the degree of influence is small. If this is done by the adhesive bonding, the positional deviation of the output lens CL2 can be suppressed to 5 μm or less, which is less than 0.5 μm when converted to the displacement amount of the laser light source LD in the prior art. In order to reduce the displacement of the YAG laser beam welding to 1 μm or less by the configuration of the prior art, a very advanced technique is required. However this can be easily achieved in the present embodiment.

(Inexpensive Implementation)

Even if there is used an expensive equipment capable of positioning the laser light source LD and a lens by YAG laser beam welding, a great deal of effort is required for the setting conditions after the installation of the equipment.

On the other hand, in the present embodiment, it is possible to construct a misalignment prevention structure with a simple apparatus combining a commercially available general-purpose optical stage. Therefore the optical axis alignment during manufacturing of the semiconductor laser module is achieved at lower cost than that of the prior art.

(Maintenance of Reliability)

Since the fixation of the laser light source LD and the input lens CL1 is performed by welding in the present embodiment, the reliability of this part is equivalent to that of the prior art. Although the misalignment factor of the output lens CL2 is newly added, the influence is 1/R or small in the present embodiment. Even if the output lens CL2 is adhesively fixed, its displacement is sufficiently small because the direction of the adhesive stress is such direction that the position of the output lens does not shift. Thus, since the present invention has a structure in which the laser light source LD and the input lens CL1 are fixed by the adhesive bonding, and the positional deviation is unlikely to occur due to temperature change and aging. Further, the present invention is useful not only for the semiconductor laser module but also for the light source part of SADB or projectors and sensors (Picopro, HUD, LiDAR, or the like) incorporating a laser light source.

It is understood that the foregoing description and accompanying drawings set forth the preferred embodiments of the present invention at the present time. Various modifications, additions and alternative designs will, of course, become apparent to those skilled in the art in light of the foregoing teachings without departing from the spirit and scope of the disclosed invention. Thus, it should be appreciated that the present invention is not limited to the disclosed Examples but may be practiced within the full scope of the appended claims. This application is based upon and claims the benefit of priority from the prior Japanese Patent Application No. 2018-082317 filed on Apr. 23, 2018, the entire contents of which are incorporated herein by reference.

What is claimed is:

1. A laser module comprising:
   a base portion having a holding portion formed of a metal material;
   a laser light source fixed to the base portion and emitting laser light;
   a collimating optical system fixed to the base portion and located on a path of the laser light; and
   an optical outputting portion deriving the laser light from the collimating optical system out of the base portion,
   wherein the collimating optical system includes
      an input lens receiving the laser light from the laser light source; and
      an output lens receiving the laser light from the input lens and outputting the laser light to the optical outputting portion, each located in order from the laser light source on the path of the laser light,
   wherein the input lens is a convex lens fixed in a first cylinder body being made of metal and welded to the holding portion,
   wherein the output lens is a convex lens having a focal point length longer than that of the input lens, the output lens being held by the holding member glued to the base portion.

2. The laser module according to claim 1, wherein the holding member includes:
   a second cylinder body holding the output lens;
   a support portion having a groove surface supporting the second cylinder body and extending along an optical axis of the laser light; and
   a unit base portion having a supporting flat surface spreading in perpendicular to an extending direction of the groove surface and being in contact to a surface of the base portion and having a through hole formed to be positioned on the path of the laser light.

3. The laser module according to claim 1, wherein the holding member has an elastic holding portion made of an elastic material that can be attached to and detached from the support portion and holding the second cylinder body by sandwiching with the groove surface,
   wherein the elastic holding portion and the groove surface movably supports the second cylinder body on the groove surface in the optical axis direction of the laser light source during alignment of the output lens,
   wherein the unit base portion is movably supported by the base portion along a plane including the supporting flat surface in a direction perpendicular to the optical axis direction of the laser light source during alignment of the output lens.

4. The laser module according to claim 1, wherein the optical outputting portion is an optical fiber.

5. The laser module according to claim 1, further comprising a convex lens disposed between the output lens and the optical outputting portion.

* * * * *